(12) United States Patent
Barve et al.

(10) Patent No.: US 12,003,076 B2
(45) Date of Patent: Jun. 4, 2024

(54) MULTI-LAYER METALLIZATION FOR MULTI-CHANNEL EMITTER ARRAY

(71) Applicant: Lumentum Operations LLC, San Jose, CA (US)

(72) Inventors: Ajit Vijay Barve, San Jose, CA (US); Matthew Glenn Peters, Menlo Park, CA (US); Eric R. Hegblom, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 962 days.

(21) Appl. No.: 16/947,351

(22) Filed: Jul. 29, 2020

(65) Prior Publication Data

US 2021/0344174 A1    Nov. 4, 2021

Related U.S. Application Data

(60) Provisional application No. 63/018,038, filed on Apr. 30, 2020.

(51) Int. Cl.
| | |
|---|---|
| *H01S 5/42* | (2006.01) |
| *G01S 7/481* | (2006.01) |
| *G01S 7/484* | (2006.01) |
| *G01S 17/10* | (2020.01) |
| *H01S 5/042* | (2006.01) |
| *H01S 5/10* | (2021.01) |
| *H01S 5/183* | (2006.01) |

(52) U.S. Cl.
CPC ............ *H01S 5/423* (2013.01); *G01S 7/4815* (2013.01); *G01S 7/484* (2013.01); *G01S 17/10* (2013.01); *H01S 5/04252* (2019.08); *H01S 5/1071* (2013.01); *H01S 5/18305* (2013.01); *H01S 5/18311* (2013.01)

(58) Field of Classification Search
CPC ........ G01S 7/4815; G01S 7/484; G01S 17/10; H01L 33/005; H01S 5/04252; H01S 5/1071; H01S 5/183; H01S 5/18305; H01S 5/18311; H01S 5/423
See application file for complete search history.

(56) References Cited

U.S. PATENT DOCUMENTS

| | | | |
|---|---|---|---|
| 11,063,407 B1 * | 7/2021 | Ginzburg | H01S 5/0624 |
| 2011/0274130 A1 * | 11/2011 | Abeles | H01S 5/04257 372/45.01 |

(Continued)

*Primary Examiner* — Yuqing Xiao
*Assistant Examiner* — Benjamin Richard Hebert
(74) *Attorney, Agent, or Firm* — Harrity & Harrity, LLP

(57) ABSTRACT

A method for fabricating an array of emitters may include providing a first metallization layer for a first set of emitters of a first channel, wherein the first metallization layer comprises a first interchannel portion positioned between the first set of emitters and a second set of emitters of a second channel. The method may include depositing a dielectric layer on the first interchannel portion of the first metallization layer. The method may include providing a second metallization layer for the second set of emitters, wherein the second metallization layer comprises a second interchannel portion positioned between the first set of emitters and the second set of emitters, and wherein the second interchannel portion of the second metallization layer at least partially overlaps the first interchannel portion of the first metallization layer.

24 Claims, 8 Drawing Sheets

(56) References Cited

U.S. PATENT DOCUMENTS

| | | | |
|---|---|---|---|
| 2016/0365284 A1* | 12/2016 | Taylor | H01L 21/31111 |
| 2017/0070027 A1 | 3/2017 | Kondo et al. | |
| 2018/0269655 A1 | 9/2018 | Koyama et al. | |
| 2019/0109436 A1 | 4/2019 | Hegblom | |
| 2019/0229240 A1* | 7/2019 | Pfeuffer | H01L 33/005 |
| 2020/0057145 A1* | 2/2020 | Townsend | H01S 5/423 |
| 2020/0119527 A1 | 4/2020 | Hegblom | |
| 2020/0144792 A1* | 5/2020 | Dummer | H01S 5/04256 |
| 2021/0305782 A1* | 9/2021 | Roucka | H01S 5/04256 |

* cited by examiner

MULTI-LAYER METALLIZATION FOR MULTI-CHANNEL EMITTER ARRAY

RELATED APPLICATION

This application claims priority to U.S. Provisional Patent Application No. 63/018,038, for "DUAL-METAL PROCESS TO INCREASE TRACE WIDTH OF INDIVIDUAL VERTICAL CAVITY SURFACE EMITTING LASER CHANNELS FOR TIME OF FLIGHT ILLUMINATORS," filed on Apr. 30, 2020, the content of which is incorporated by reference herein in its entirety.

TECHNICAL FIELD

The present disclosure relates generally to an emitter array and, more particularly to an emitter array including multiple metal layers for addressing different channels of emitters.

BACKGROUND

An emitter may include a vertical cavity surface emitting laser (VCSEL), such as a top-emitting VCSEL, a bottom-emitting VCSEL, a common anode VCSEL, a common cathode VCSEL, and/or the like, as well as a line scanning laser, and/or the like. A VCSEL is a laser in which a beam is emitted in a direction perpendicular to a surface of the VCSEL (e.g., vertically from a surface of the VCSEL). Multiple emitters may be arranged in an emitter array with a common substrate.

SUMMARY

According to some implementations, a method may include providing a first metallization layer for a first set of emitters of a first channel, wherein the first metallization layer comprises a first interchannel portion positioned between the first set of emitters and a second set of emitters of a second channel, depositing a dielectric layer on the first interchannel portion of the first metallization layer, and providing a second metallization layer for the second set of emitters, wherein the second metallization layer comprises a second interchannel portion positioned between the first set of emitters and the second set of emitters, and wherein the second interchannel portion of the second metallization layer at least partially overlaps the first interchannel portion of the first metallization layer.

According to some implementations, an optical chip may include a first channel comprising a first set of emitters, a first set of contacts for each of the first set of emitters of the first channel, a first dielectric layer, a first metallization layer on the first set of contacts and the first dielectric layer, wherein the first metallization layer comprises a first interchannel portion positioned between the first set of emitters and a second set of emitters, a second channel comprising the second set of emitters, a second set of contacts for each of the second set of emitters of the second channel, a second dielectric layer on the first metallization layer and the first dielectric layer, and a second metallization layer on the second set of contacts and the second dielectric layer, wherein the second metallization layer comprises a second interchannel portion positioned between the first set of emitters and the second set of emitters, and wherein the second interchannel portion of the second metallization layer at least partially overlaps the first interchannel portion of the first metallization layer.

According to some implementations, a time-of-flight system may include an array of emitters to emit optical beams into a field of view, wherein the array of emitters comprises a first channel comprising a first set of emitters, a second channel comprising a second set of emitters, a first metallization layer to provide electrical contact between a drive circuit and the first set of emitters, a dielectric layer on the first metallization layer, and a second metallization layer, on the dielectric layer, to provide electrical contact between the drive circuit and the second set of emitters, wherein the second metallization layer at least partially overlaps with the first metallization layer; the drive circuit; and a receiver to receive light reflected from the field of view.

DETAILED DESCRIPTION

The following detailed description of example implementations refers to the accompanying drawings. The same reference numbers in different drawings may identify the same or similar elements.

Time-of-flight (TOF) systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses. A TOF system may include an array of emitters (e.g. a VCSEL array and/or the like) with rows of emitters, where each row corresponds to a channel and multiple emitters are in each row. Each channel of emitters may have a metallization layer provided on top of the emitter array to provide an electrical connection between the emitters and a bondpad for connecting to a drive circuit.

Emitter separation within a channel (e.g., within a row corresponding to the channel) may determine an angular resolution of a sensor of the TOF system in a horizontal direction, and spacing between different rows may determine vertical resolution. Reducing spacing between rows of emitters improves vertical resolution of the time-of-flight system. However, a gap must be maintained between each metallization layer, and fabrication constraints limit the reduction of the gap. Furthermore, reducing the spacing between rows of emitters requires reducing a width of the metallization layer, which increases the resistance of the metallization layer and reduces efficiency of the time-of-flight system.

Some implementations described herein provide a method that includes providing a first metallization layer for a first set of emitters of a first channel, depositing a dielectric layer on the first metallization layer, and providing a second metallization layer for a second set of emitters on the dielectric layer, where the second metallization layer at least partially overlaps the first metallization layer. The dielectric layer insulates the first and second metallization layers from each other, thereby permitting the first and second metallization layers to overlap. By permitting the first and second metallization layers to overlap, spacing between rows of emitters may be reduced, to improve resolution, and widths of the first and second metallization layers may be increased, to improve efficiency of the time-of-flight system.

Figure 1A:
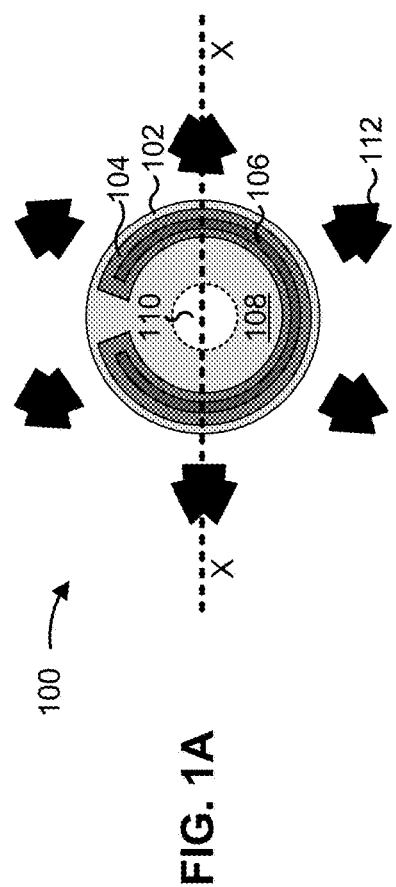
FIGS. 1A and 1B are diagrams of a top view of an example emitter and an example cross-sectional view of the example emitter, respectively, described herein.
Figure 1B:
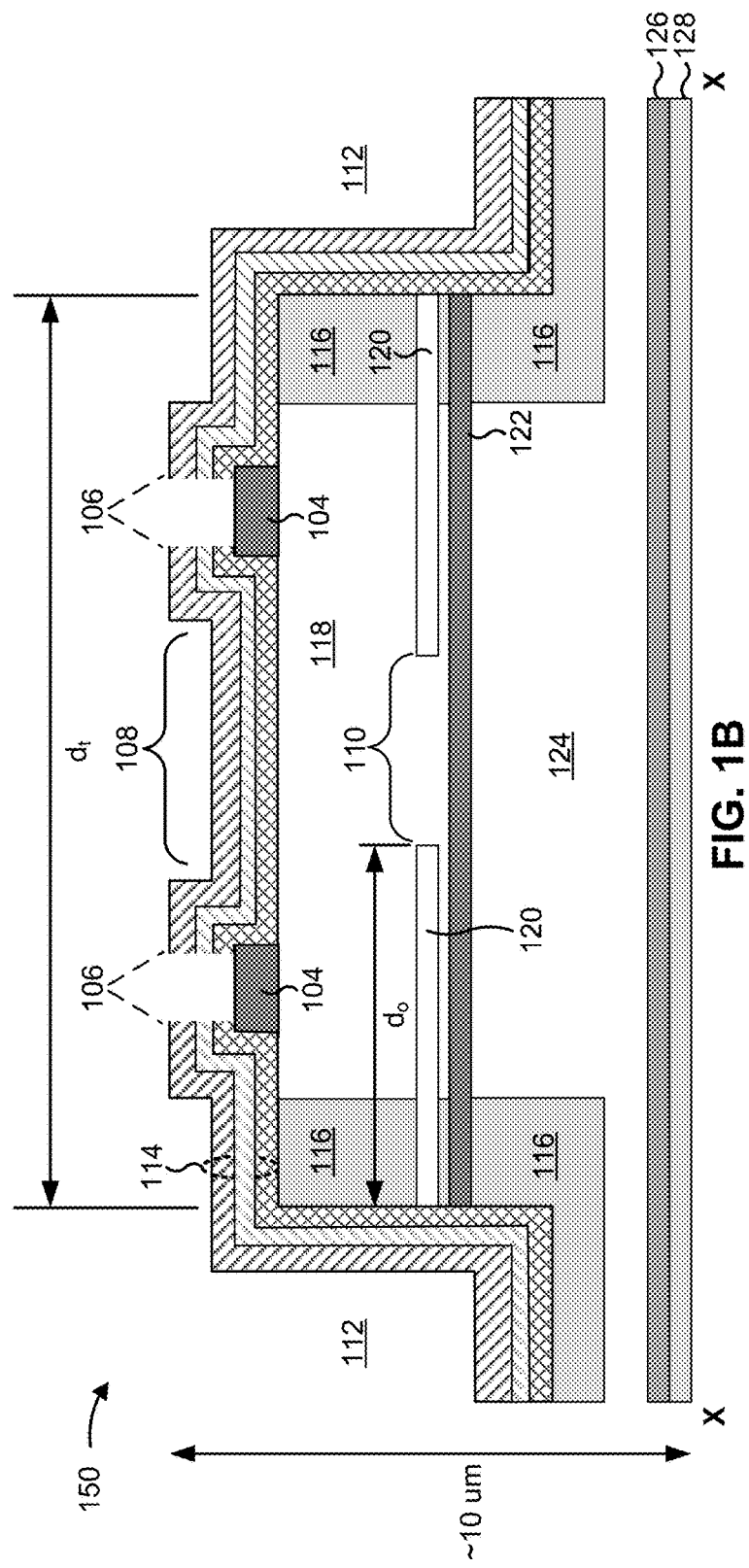

FIGS. 1A and 1B are diagrams depicting a top view of an example emitter 100, and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a p-ohmic metal layer or an n-ohmic metal layer) that is constructed in a partial ring-shape (e.g., with an inner radius and an outer radius). The medium gray area shows an area of ohmic metal layer 104 covered by a protective layer (e.g., a dielectric layer, a passivation layer, and/or the like) of emitter 100 and the dark gray area shows an area of ohmic metal layer 104 exposed by via 106, described below. As shown, ohmic metal layer 104 overlaps with implant protection layer 102. Such a configuration may be used, for example, in the case of a p-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium gray area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, and/or the like. In some implementations, trench 112 may encircle emitter 100 to form a mesa structure dt. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, emission profile, and/or the like. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 microns (µm).

Backside cathode layer 128 may include a layer that makes electrical contact with substrate layer 126. For example, backside cathode layer 128 may include an annealed metallization layer, such as a gold-germanium-nickel (AuGeNi) layer, a palladium-germanium-gold (PdGeAu) layer, and/or the like.

Substrate layer 126 may include a base substrate layer upon which epitaxial layers are grown. For example, substrate layer 126 may include a semiconductor layer, such as a gallium arsenide (GaAs) layer, an indium phosphide (InP) layer, and/or the like.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an aluminum oxide ($Al_2O_3$) layer formed as a result of oxidation of an aluminum arsenide (AlAs) or an aluminum-gallium-arsenide (AlGaAs) layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a silicon dioxide ($SiO_2$) layer, a silicon nitride ($Si_3N_4$) layer, an aluminum oxide ($Al_2O_3$) layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a titanium (Ti) and gold (Au) layer, a Ti and platinum (Pt) layer and/or an Au layer, or the like, through which electrical current may flow (e.g., through a metallization layer (not shown) that contacts ohmic metal layer 104 through via 106). Ohmic metal layer 104 may be p-ohmic, n-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100, and any layer may comprise more than one layer.

Figure 2:
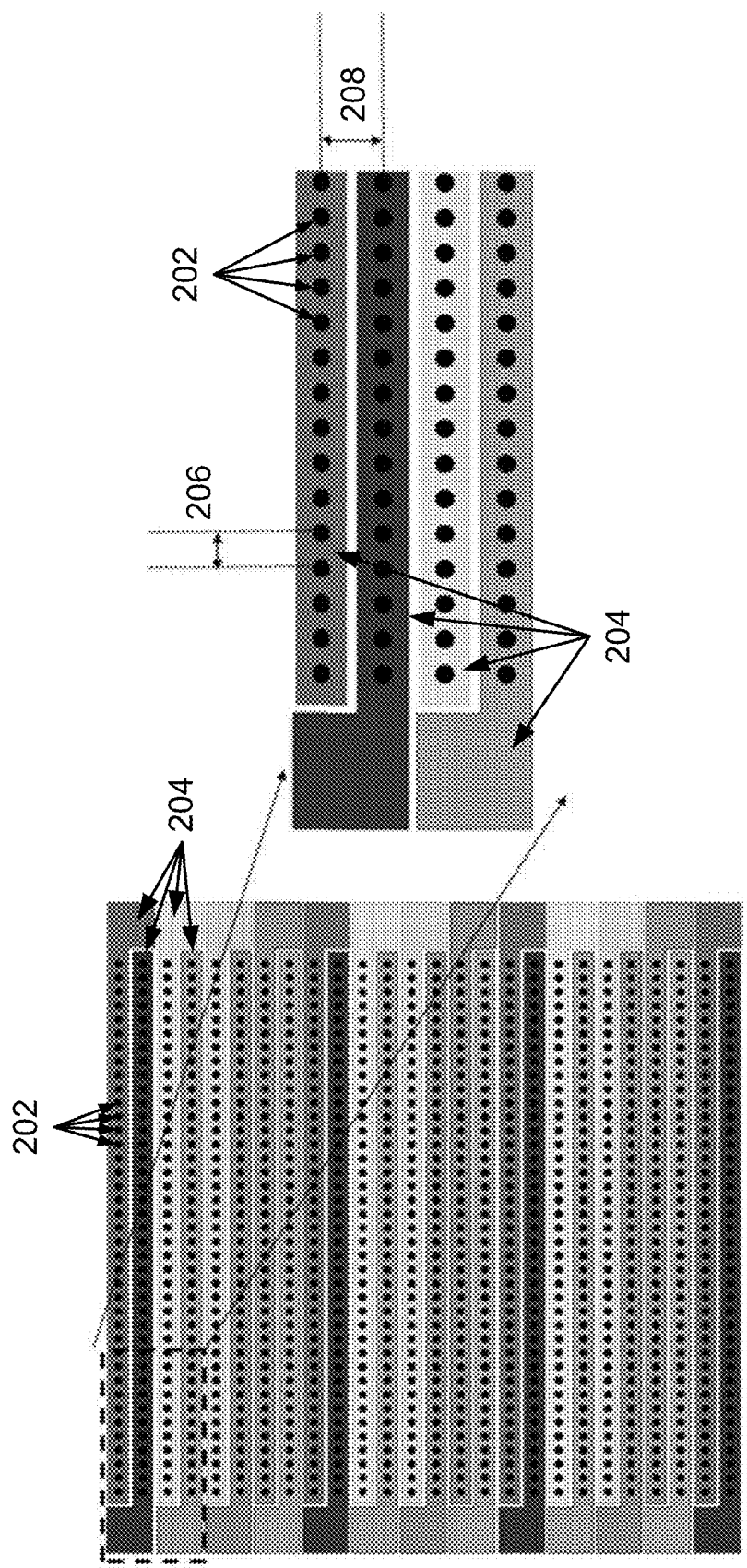
FIG. 2 is a diagram of a top view of a conventional array of emitters described herein.

FIG. 2 is a diagram of a top view of a conventional array of emitters 202. As shown in FIG. 2, the array includes multiple channels 204, where each channel includes a row of emitters 202. For example, each shade of gray in FIG. 2 may represent a metallization layer (e.g., a trace) of a channel. As shown in the inset on the right side of FIG. 2, each emitter 202 may be separated from other emitters 202 by an x-pitch 206 and a y-pitch 208, where the x-pitch 206 is a distance between emitters 202 within a same row and the y-pitch 208 is a distance between emitters 202 in adjacent rows.

As noted above, reducing row-to-row spacing (e.g., the y-pitch 208) may increase the vertical resolution of a sensor of a TOF system. However, reduction of the y-pitch 208 may be limited by a width of the metallization layer formed on the row of emitters 202 (e.g., of a channel) and/or spacing between two adjacent metallization layers. In conventional fabrication, the metallization layers for the channels 204 are formed at the same time, using a metallization process, which, as described further herein, has fabrication tolerances and/or rules limiting reduction of spacing between adjacent channels 204 (e.g., the y-pitch 208).

Figure 3:
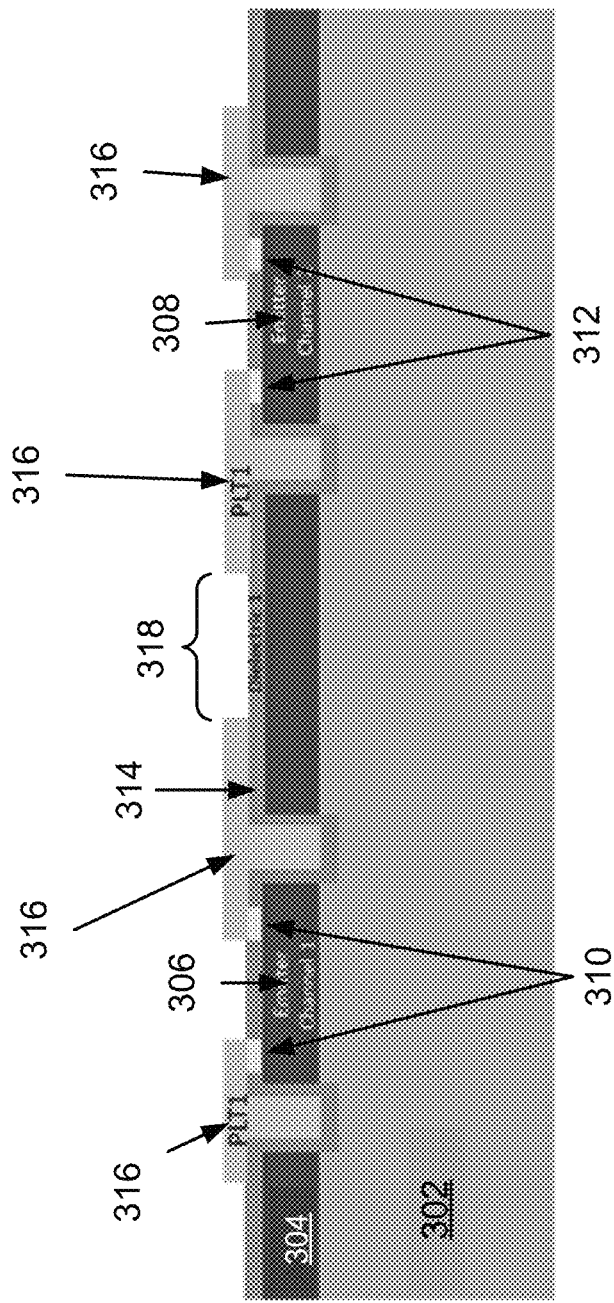
FIG. 3 is a diagram of a cross-sectional view of the conventional array of emitters of FIG. 2 described herein.

FIG. 3 is a diagram of a cross-sectional view of the conventional array of emitters 202 of FIG. 2 described herein. As shown in FIG. 3, the array of emitters 202 may include a substrate layer 302, active layers 304, a first channel of emitters 306, a second channel of emitters 308, first contacts 310, second contacts 312, a dielectric layer 314, and a metallization layer 316. The first channel of emitters 306 and the second channel of emitters 308 correspond to two adjacent channels 204 of the conventional array of emitters 202 of FIG. 2. Furthermore, the cross-sectional view of FIG. 3 may depict a cross-sectional positional relationship of each pair of adjacent channels 204 of the conventional array of emitters 202 of FIG. 2.

As shown in FIG. 3, the metallization layer 316 may include a first trace for the first channel of emitters 306 and a second trace for the second channel of emitters 308. When the first trace and the second trace are deposited in one fabrication step, a gap 318 must be maintained between the first trace and the second trace to avoid shorting. A width of the gap 318 and/or thicknesses of the first trace and the second trace may be determined by fabrication tolerances and/or rules. For example, fabrication tolerances and/or rules may require that two adjacent traces (e.g., the first trace and the second trace) be a certain distance apart (e.g., 3-10 microns). Accordingly, reducing the width of the gap 318 (e.g., to increase vertical resolution) requires reducing a width of the first trace and the second trace. However, each of the first trace and the second trace carries a large current (e.g., 40-400 milliamps per emitter peak current), and reducing the width of the first trace and the second trace results in a large voltage penalty due to additional inductance and resistance of a long and narrow trace.

Figure 4:
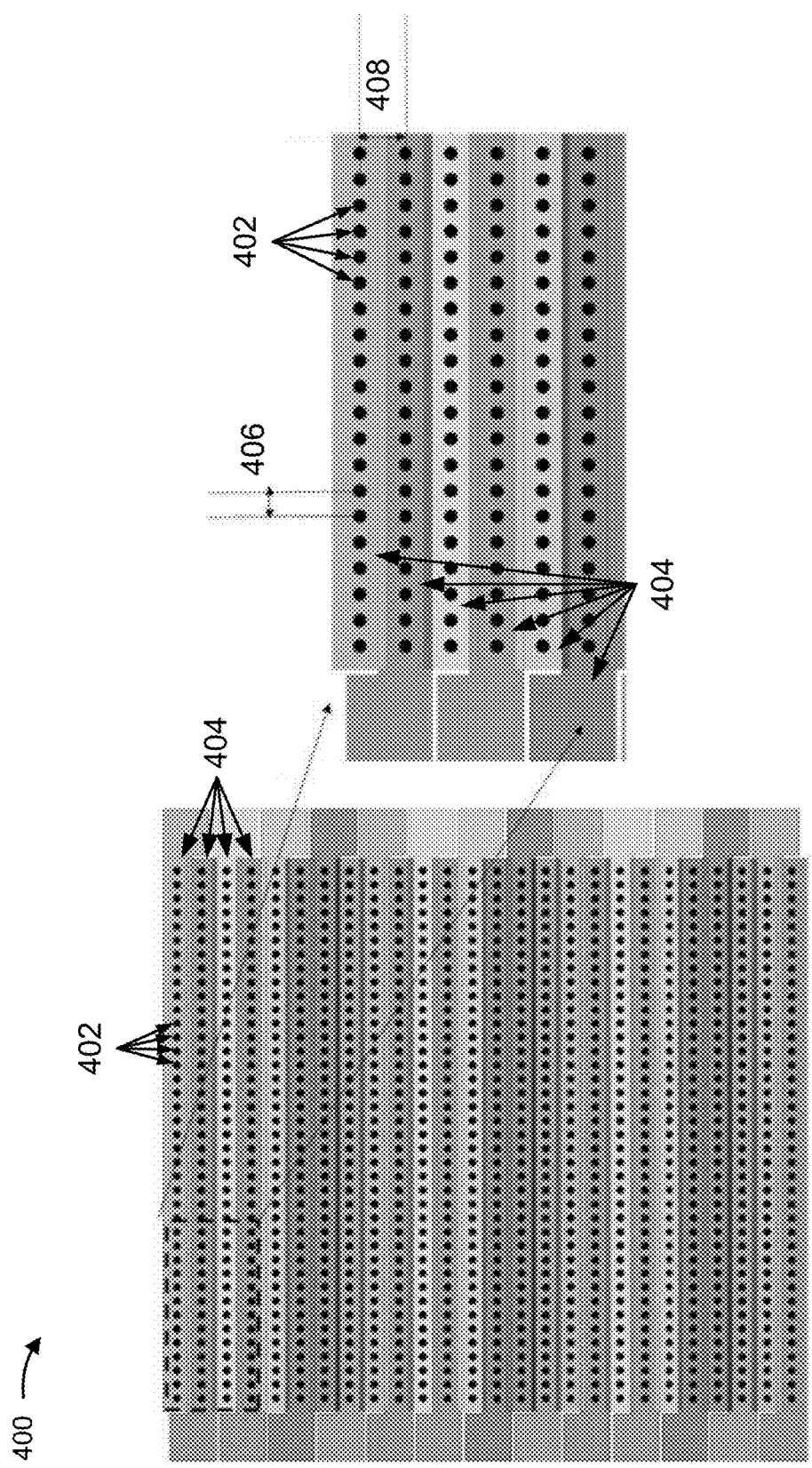
FIG. 4 is a diagram of a top view of an example implementation of an array of emitters described herein.

FIG. 4 is a diagram of a top view of an example implementation 400 of an array of emitters 402 described herein. In some implementations, the array of emitters 402 may be referred to as an optical chip. As shown in FIG. 4, the array includes multiple channels 404, where each channel includes a row of emitters 402. For example, each shade in FIG. 4 may represent a metallization layer (e.g., a trace) of a channel. As shown in the inset on the right side of FIG. 4, each emitter 402 may be separated from other emitters 402 by an x-pitch 406 and a y-pitch 408, where the x-pitch 406 is a distance between centers of emitters 402 within a same row and the y-pitch 408 is a distance between centers of emitters 402 in adjacent rows.

As shown in FIG. 4, the emitters 402 may include sets of emitters 402, where each set of emitters 402 is positioned in a row (e.g., to form the channels 404), and where the rows are parallel to each other. In some implementations, depending on an architecture of the array and/or a TOF system including the array, each "row" may contain more than one row of emitters. Additionally, or alternatively, emitters from two channels 404 may be staggered in an x-direction (e.g., a horizontal direction).

In some implementations, the emitters 402 may include VCSELs (e.g., top-emitting VCSELs, bottom-emitting VCSELs, common anode VCSELs, common cathode VCSELs, and/or the like), line scanning lasers, and/or the like. For example, one or more of the emitters 402 may be similar to emitter 100 shown in and described herein with respect to FIGS. 1A and 1B.

In some implementations, a metallization layer for the channels 404 extending from a right side of the array to the left side of the array (e.g., a channel at a top of the array, a third channel down from the top of the array, and/or the like) may be provided (e.g., deposited) at a different process step as compared to a metallization layer for the channels 404 extending from left to right (e.g., a second channel down from the top of the array, a fourth channel down from the top of the array, and/or the like). Additionally, or alternatively, a dielectric layer may separate each channel from one or more adjacent channels. In this way, and as described further herein with respect to FIG. 6, the array may include adjacent channels 404 including metallization layers that overlap with each other in the x-direction and/or the y-direction and are staggered with respect to each other in a z-direction orthogonal to the x-direction and the y-direction.

As indicated above, FIG. 4 is provided as an example. Other examples may differ from what is described with regard to FIG. 4.

Figure 5:
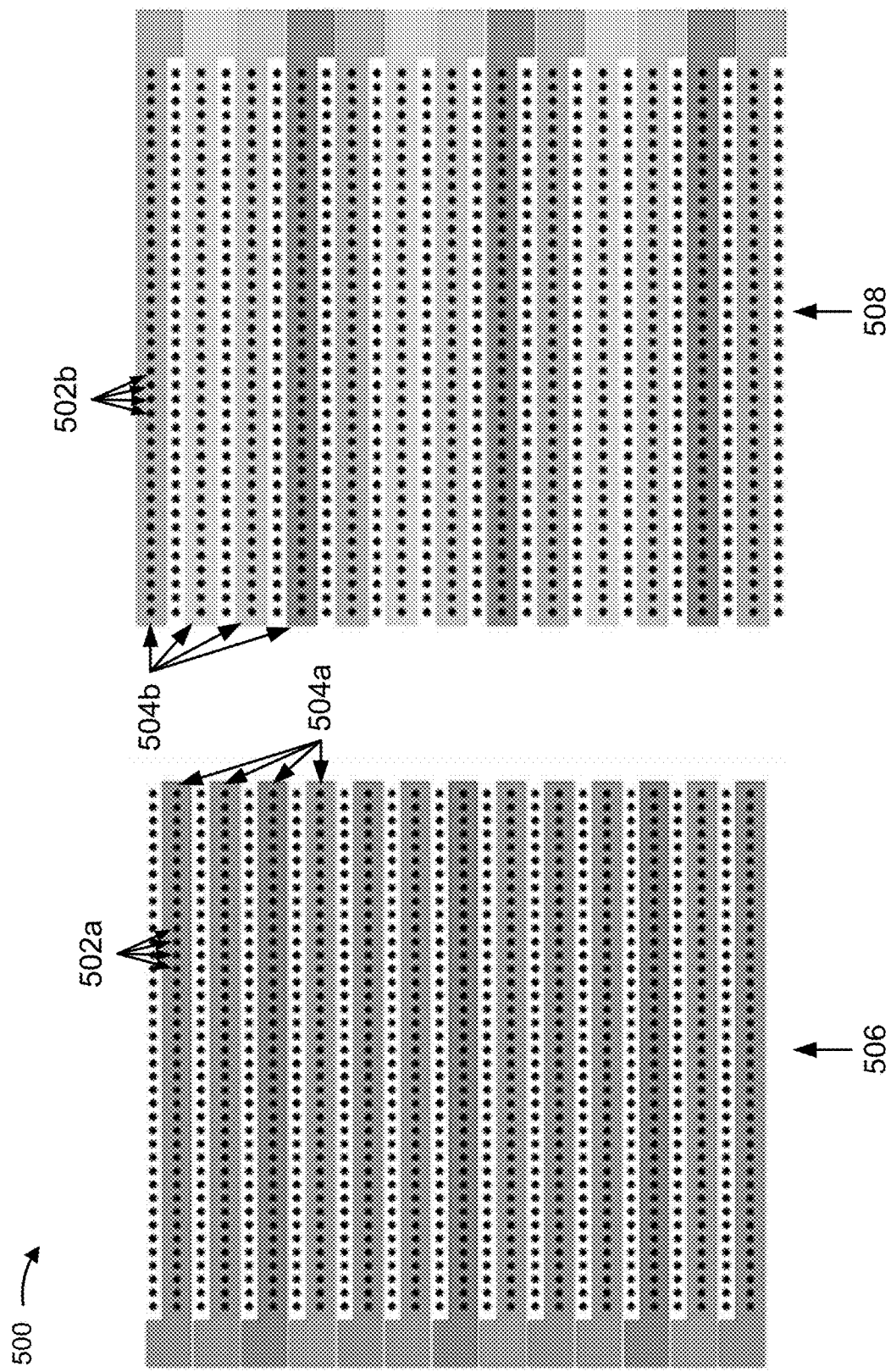
FIG. 5 is a diagram of an example implementation of a fabrication process for an array of emitters described herein.

FIG. 5 is a diagram of an example implementation 500 of a fabrication process for an array of emitters (e.g., an optical chip) described herein. For example, the array of emitters of example implementation 400 may be fabricated using the fabrication process of example implementation 500. As shown in FIG. 5, the array includes a first set of emitters 502a of a first set of channels 504a, and a second set of emitters 502b of a second set of channels 504b. As also shown in FIG. 5, the first set of channels 504a may extend from a left side of the array to a right side of the array, and the second set of channels 504b may extend from the right side of the array to the left side of the array.

In some implementations, and as shown in FIG. 5, the fabrication process may include a first step 506 and a second step 508. The first step 506 may include providing a metallization layer (e.g., a photomask, a trace, and/or the like) for the first set of channels 504a. The second step 508 may include providing another metallization layer for the second set of channels 504b.

By using different process steps to provide metallization layers to adjacent channels, the fabrication rules requiring that two adjacent metallization layers be a certain distance apart may no longer apply. For example, metallization layers (e.g., traces) for adjacent channels may spatially overlap with each other. Thus, each metallization layer may be wider, for a same y-pitch, than metallization layers deposited during a single process step (e.g., without modifying the x-pitch). Furthermore, increasing a width of each metallization layer lowers resistance and/or inductance of each metallization layer. In some implementations, a thickness of a dielectric layer between metallization layers may be adjusted to offset increased parasitic inductance of wider metallization layers.

In some implementations having a top-emitting architecture (e.g., including top-emitting VCSELs and/or the like), a width of metallization layers (e.g., traces) may be limited by one or more openings for emission areas (e.g., through which the emitters emit light). In some implementations having a bottom-emitting architecture (e.g., including bottom-emitting VCSELs and/or the like) in which emitters emit light through a substrate, a width of metallization layers may not be limited in such a manner and may overlap with emission areas of adjacent channels.

As indicated above, FIG. 5 is provided as an example. Other examples may differ from what is described with regard to FIG. 5.

Figure 6:
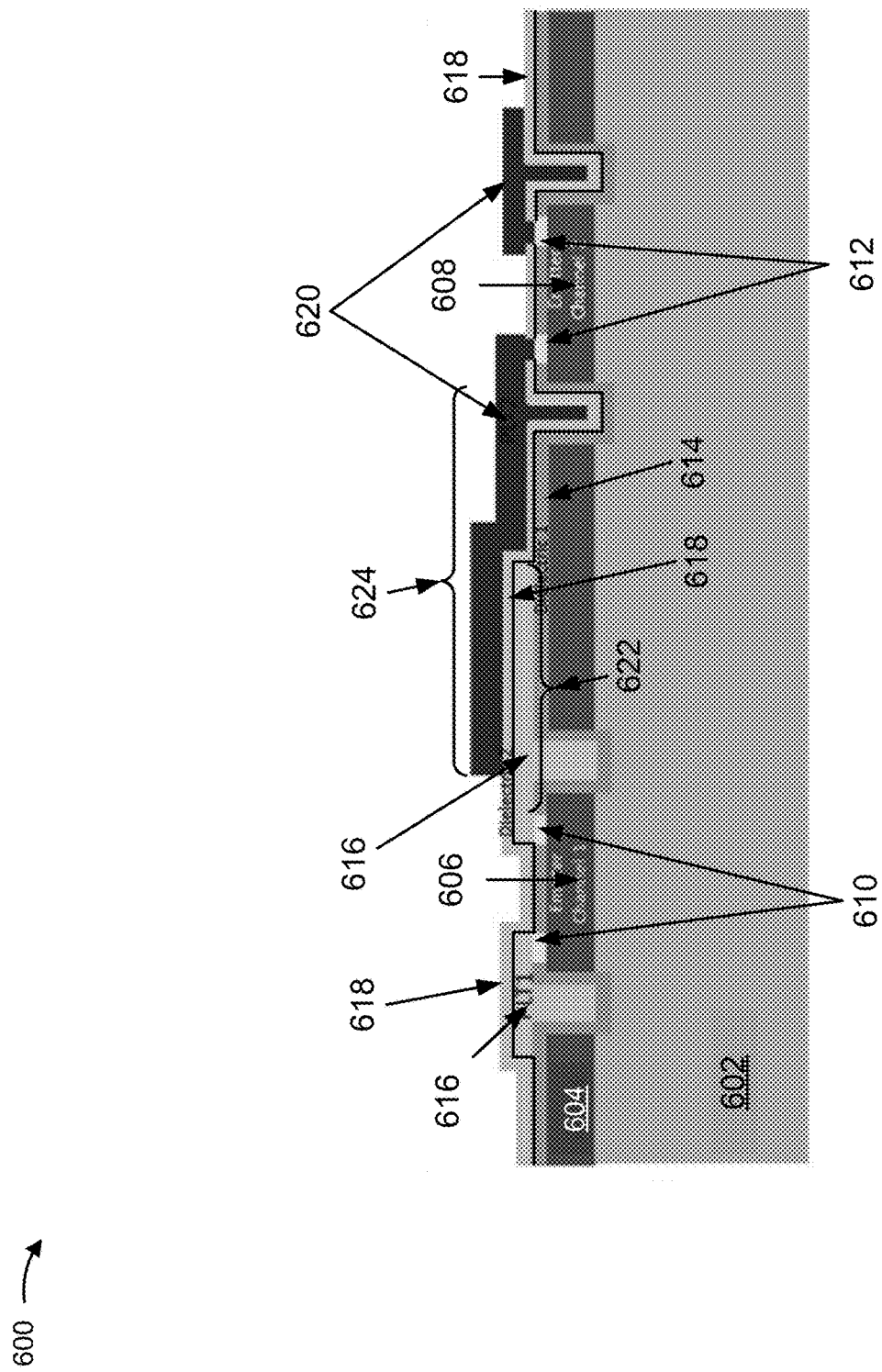
FIG. 6 is a diagram of a cross-sectional view of an example implementation of an array of emitters described herein.

FIG. 6 is a diagram of a cross-sectional view of an example implementation 600 of an array of emitters (e.g., an optical chip) described herein. As shown in FIG. 6, the array of emitters may include a substrate layer 602, active layers 604, a first channel of emitters 606, a second channel of emitters 608, first contacts 610 (e.g., a first set of contacts), second contacts 612 (e.g., a second set of contacts), a first dielectric layer 614, a first metallization layer 616, a second dielectric layer 618, and a second metallization layer 620. In some implementations, the first channel of emitters 606 and the second channel of emitters 608 correspond to two adjacent channels 404 of the array of emitters 402 of FIG. 4. Additionally, or alternatively, the first channel of emitters 606 and the second channel of emitters 608 may correspond, respectively, to the first set of channels 504a and the second set of channels 504b of FIG. 5. Furthermore, the cross-sectional view of FIG. 6 may depict a cross-sectional positional relationship of each pair of adjacent channels 404 of the array of emitters 402 of FIG. 4 and/or each pair of adjacent channels 504a and 504b of the array of FIG. 5.

In some implementations, the first channel of emitters 606 and/or the second channel of emitters 608 may include one or more emitters similar to emitter 100 shown in and described herein with respect to FIGS. 1A and 1B. For example, the substrate layer 602 of FIG. 6 may be similar to the substrate layer 126 shown in and described herein with respect to FIGS. 1A and 1B. Additionally, or alternatively, the active layers 604 of FIG. 6 may be similar to and/or may include one or more of the current confinement aperture 110, the implant isolation material 116, the top mirror 118, the oxidation layer 120, the active region 122, the bottom mirror 124, and/or the like as shown in and described herein with respect to FIGS. 1A and 1B.

In some implementations, the first contacts 610 and/or the second contacts 612 may be similar to the ohmic metal layer 104 shown in and described herein with respect to FIGS. 1A and 1B. Additionally, or alternatively, the first dielectric layer 614 and/or the second dielectric layer 618 may be similar to the protective layer 114 shown in and described herein with respect to FIGS. 1A and 1B.

As shown in FIG. 6, the active layers 604 may be deposited on the substrate layer 602, and the first contacts 610 and the second contacts 612 may be positioned on an uppermost layer of the active layers 604. In some implementations, the first contacts 610 may include a first set of contacts for each emitter in the first channel of emitters 606, and the second contacts 612 may include a second set of contacts for each emitter in the second channel of emitters 608.

As shown in FIG. 6, the first dielectric layer 614 may be positioned on the uppermost layer of the active layers 604. In some implementations, the first dielectric layer 614 may be etched to expose the first contacts 610 and/or the second contacts 612.

As shown in FIG. 6, the first metallization layer 616 may be positioned on the first contacts 610 and the first dielectric layer 614. The first metallization layer 616 and the first contacts 610 may provide electrical contact between a drive circuit and the first channel of emitters 606.

In some implementations, and as shown in FIG. 6, the first metallization layer 616 may include an interchannel portion 622 positioned between the first channel of emitters 606 and the second channel of emitters 608. For example, a portion of the first metallization layer 616 shown in FIG. 6 to the right of the first channel of emitters 606 may be the interchannel portion 622 of the first metallization layer 616.

As shown in FIG. 6, the second dielectric layer 618 may be positioned on the first metallization layer 616 and the first dielectric layer 614. In some implementations, the second dielectric layer 618 may be etched to expose the second contacts 612.

As shown in FIG. 6, the second metallization layer 620 may be positioned on the second contacts 612 and the second dielectric layer 618. The second metallization layer 620 and the second contacts 612 may provide electrical contact between a drive circuit and the second channel of emitters 608.

In some implementations, and as shown in FIG. 6, the second metallization layer 620 may also include an interchannel portion 624 positioned between the first channel of emitters 606 and the second channel of emitters 608. For example, a portion of the first metallization layer 616 shown in FIG. 6 to the left of the second channel of emitters 608 may be the interchannel portion 624 of the second metallization layer 620.

As shown in FIG. 6, the interchannel portion 622 of the first metallization layer 616 and the interchannel portion 624 of the second metallization layer 620 may at least partially overlap. As also shown in FIG. 6, the second dielectric layer 618 may be positioned between overlapping portions of the first metallization layer 616 and the second metallization layer 620, and may insulate the first metallization layer 616 and the second metallization layer 620 from each other. In some implementations, the first metallization layer 616 and the second metallization layer 620 may not overlap, but may be closer to each other than would be allowed by typical fabrication tolerances and/or rules (e.g., to avoid shorting, as described herein in relation to FIG. 3) By permitting the first metallization layer 616 and the second metallization layer 620 to overlap and/or be close to each other, the second dielectric layer 618 may allow spacing between rows of emitters to be reduced to improve resolution, and widths and/or thicknesses of the first metallization layer 616 and the second metallization layer 620 to be increased to improve efficiency of a time-of-flight system (e.g., by reducing impedance of the first metallization layer 616 and/or the second metallization layer 620).

In some implementations, the first metallization layer 616 and/or the second metallization layer 620 may be formed with plated metal, using electron-beam (e-beam) physical vapor deposition, using metal sputtering deposition, and/or the like. Additionally, or alternatively, the first metallization layer 616 and/or the second metallization layer 620 may include Au, aluminum (Al), copper (Cu), nickel gold (NiAu), and/or the like.

As indicated above, FIG. 6 is provided as an example. Other examples may differ from what is described with regard to FIG. 6.

Figure 7:
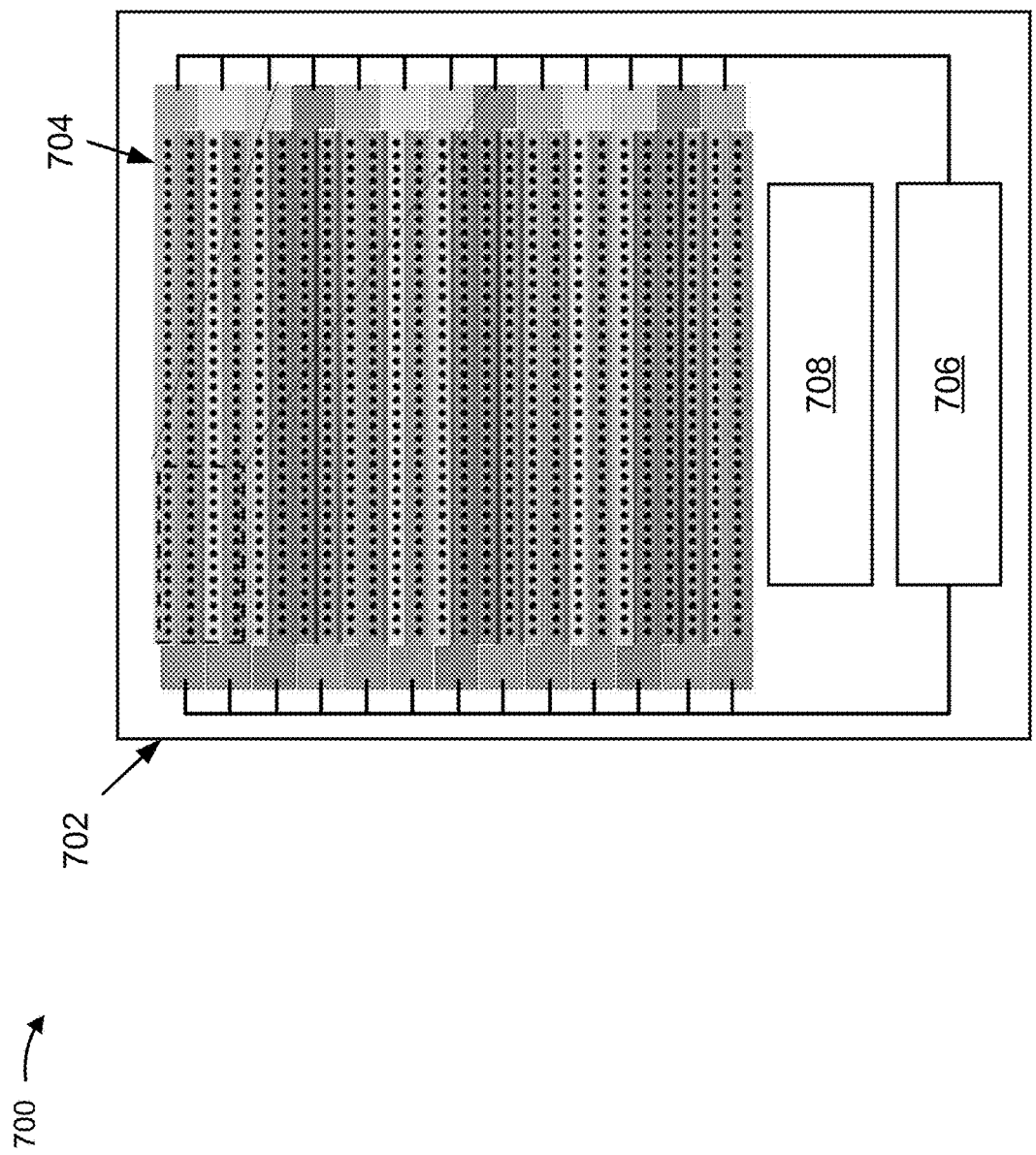
FIG. 7 is a diagram of an example implementation of a time-of-flight system including an array of emitters described herein.

FIG. 7 is a diagram of an example implementation 700 of a time-of-flight system 702 including an array of emitters 704 described herein. As shown in FIG. 7, the time-of-flight system 702 may include the array of emitters 704 (e.g., an optical chip), a drive circuit 706, and a receiver 708.

In some implementations, the array of emitters 704 may be similar to the array of emitters shown in and described herein with respect to FIGS. 4-6. In some implementations, the array of emitters 704 may include multiple channels with metallization layers, where the metallization layers for adjacent channels at least partially overlap, and a dielectric layer is positioned between overlapping portions of the metallization layers. Additionally, or alternatively, the array of emitters 704 may include a plurality of metallization layers and one or more dielectric layers positioned between overlapping portions of adjacent metallization layers of the plurality of metallization layers. In some implementations, the metallization layers (e.g., including bondpads) may provide electrical contact between emitters in the channels of the array and the drive circuit 706.

In some implementations, the drive circuit 706 may generate one or more electrical signals (e.g., drive signals) to drive the array of emitters 704 to emit one or more optical pulses. For example, and as shown in FIG. 7, the drive circuit 706 may be electrically connected to each channel (e.g., via a bondpad) in the array of emitters 704, and may individually drive each channel, separately drive groups of channels, simultaneously drive the channels, and/or the like (e.g., based on an application for the time-of-flight system 702).

In some implementations, the receiver 708 may include one or more photodetectors, photosensors, photodiodes, phototransistors, and/or the like. Additionally, or alternatively, the receiver 708 may be configured to generate an electrical signal based on optical signals.

In some implementations, during operation of the time-of-flight system 702, the drive circuit 706 may generate drive signals to drive the array of emitters 704 to emit optical beams into a field of view, and the receiver 708 may receive light (e.g., reflected optical beams) reflected from the field of view and generate, based on the received light, electrical signals. Additionally, or alternatively, the time-of-flight system 702 may determine distances to objects in the field of view by measuring delays and/or differences between the optical beams emitted by the array of emitters 704 and the light reflected from the field of view received by the receiver 708.

As indicated above, FIG. 7 is provided as an example. Other examples may differ from what is described with regard to FIG. 7.

Figure 8:
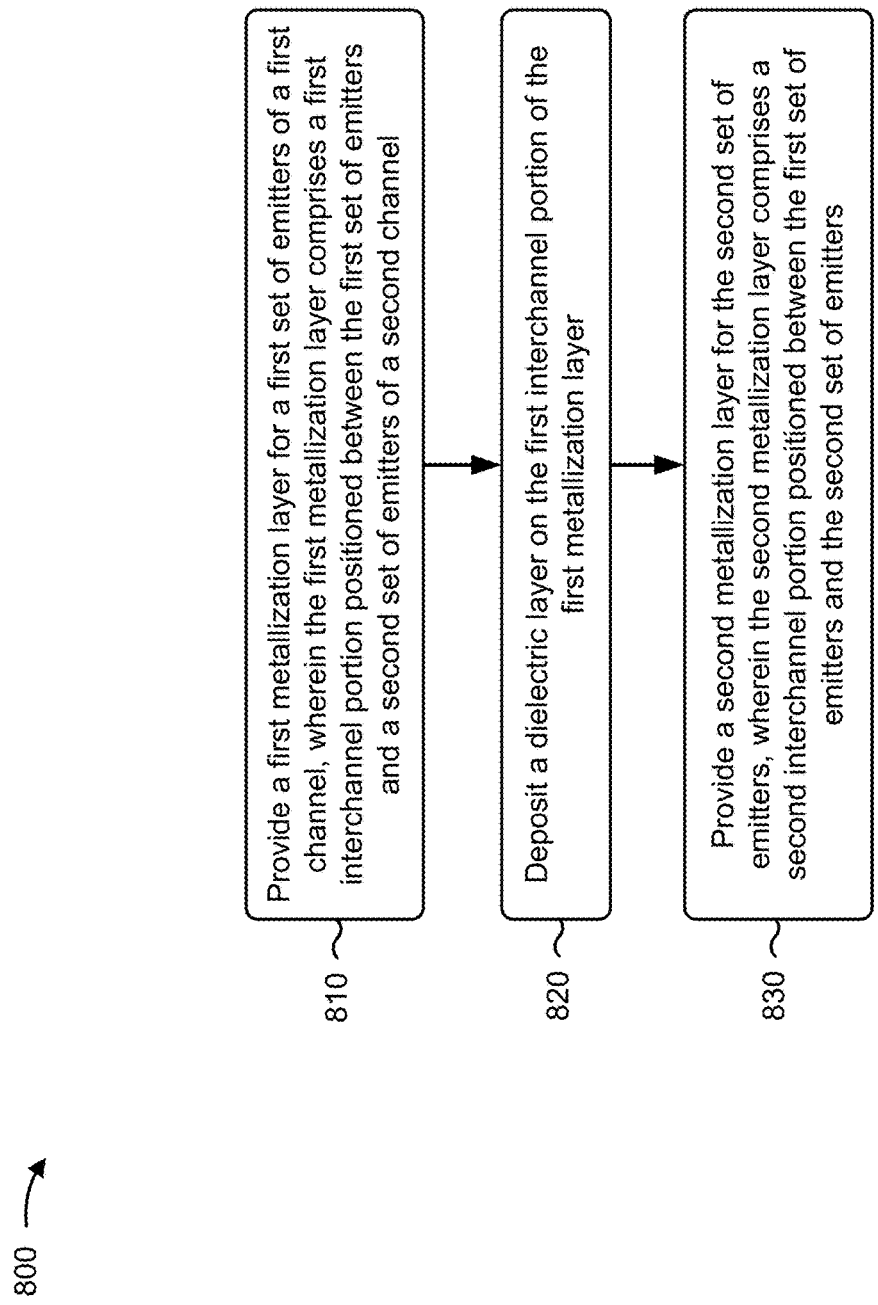
FIG. 8 is a flow chart of an example process relating to fabricating an array of emitters.

FIG. 8 is a flow chart of an example process 800 associated with fabricating an array of emitters. As shown in FIG. 8, process 800 may include providing a first metallization layer for a first set of emitters of a first channel, wherein the first metallization layer comprises a first interchannel portion positioned between the first set of emitters and a second set of emitters of a second channel (block 810).

As further shown in FIG. 8, process 800 may include depositing a dielectric layer on the first interchannel portion of the first metallization layer (block 820).

As further shown in FIG. 8, process 800 may include providing a second metallization layer for the second set of emitters, wherein the second metallization layer comprises a second interchannel portion positioned between the first set of emitters and the second set of emitters (block 830). In some implementations, the second interchannel portion of the second metallization layer at least partially overlaps the first interchannel portion of the first metallization layer Process 800 may include additional implementations, such as any single implementation or any combination of implementations described below and/or in connection with one or more other processes described elsewhere herein.

In a first implementation, providing the first metallization layer comprises at least one of forming the first metallization layer with plated metal, forming the first metallization layer using electron-beam physical vapor deposition, or forming the first metallization layer using metal sputtering deposition; or providing the second metallization layer comprises at least one of forming the second metallization layer with plated metal, forming the second metallization layer using electron-beam physical vapor deposition, or forming the second metallization layer using metal sputtering deposition.

In a second implementation, alone or in combination with the first implementation, depositing the dielectric layer comprises depositing the dielectric layer using at least one of chemical vapor deposition or atomic layer deposition.

In a third implementation, alone or in combination with one or more of the first and second implementations, process 800 includes etching, in the dielectric layer, a bondpad for the first metallization layer.

In a fourth implementation, alone or in combination with one or more of the first through third implementations, process 800 includes, before providing the first metallization layer, depositing active layers on a substrate layer to form the first set of emitters and the second set of emitters.

In a fifth implementation, alone or in combination with one or more of the first through fourth implementations, process 800 includes, before providing the first metallization layer and after depositing active layers, positioning a first set of contacts on an uppermost layer of the active layers for each emitter of the first set of emitters of the first channel, positioning a second set of contacts on the uppermost layer of the active layers for each emitter of the second set of emitters of the second channel, and etching trenches in the active layers for each emitter of the first set of emitters and for each emitter of the second set of emitters.

In a sixth implementation, alone or in combination with one or more of the first through fifth implementations, process 800 includes, after etching trenches in active layers, oxidizing the first set of emitters and the second set of emitters.

In a seventh implementation, alone or in combination with one or more of the first through sixth implementations, the dielectric layer is a second dielectric layer, and process 800 includes, after etching trenches in active layers, depositing a first dielectric layer on the active layers, and etching, in the first dielectric layer, vias for the first set of contacts.

In an eighth implementation, alone or in combination with one or more of the first through seventh implementations, providing the first metallization layer includes providing, after etching vias for the first set of contacts, the first metallization layer on the first set of contacts and the first dielectric layer, and depositing the second dielectric layer includes depositing, after providing the first metallization, the second dielectric layer on the first metallization layer and the first dielectric layer.

In a ninth implementation, alone or in combination with one or more of the first through eighth implementations, process 800 includes, after depositing the second dielectric layer, etching, in the second dielectric layer and the first dielectric layer, vias for the second set of contacts, and providing the second metallization layer includes providing, after etching vias for the second set of contacts, the second metallization layer on the second set of contacts and the second dielectric layer.

In a tenth implementation, alone or in combination with one or more of the first through ninth implementations, process 800 includes positioning a third set of contacts on the active layers for each emitter of a third set of emitters of a third channel, wherein the second metallization layer comprises a third interchannel portion positioned between the second set of emitters and the third set of emitters, depositing a third dielectric layer on the second metallization layer and the second dielectric layer, and providing a third metallization layer on the third set of contacts and the third dielectric layer, wherein the third metallization layer includes a fourth interchannel portion positioned between the second set of emitters and the third set of emitters. The fourth interchannel portion of the third metallization layer may at least partially overlap the third interchannel portion of the second metallization layer.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method, comprising:
   providing a first metallization layer for a first set of emitters of a first channel,
      wherein the first metallization layer comprises a first interchannel portion positioned between the first set of emitters and a second set of emitters of a second channel, and
      wherein the second channel is substantially parallel to the first channel;
   depositing a dielectric layer on the first interchannel portion of the first metallization layer; and
   providing a second metallization layer for the second set of emitters,
      wherein the second metallization layer comprises a second interchannel portion positioned between the first set of emitters and the second set of emitters.

2. The method of claim 1, wherein providing the first metallization layer comprises at least one of forming the first metallization layer with plated metal, forming the first metallization layer using electron-beam physical vapor deposition, or forming the first metallization layer using metal sputtering deposition; or
   wherein providing the second metallization layer comprises at least one of forming the second metallization layer with plated metal, forming the second metallization layer using electron-beam physical vapor deposition, or forming the second metallization layer using metal sputtering deposition.

3. The method of claim 1, wherein depositing the dielectric layer comprises depositing the dielectric layer using at least one of chemical vapor deposition or atomic layer deposition.

4. The method of claim 1, further comprising:
   etching, in the dielectric layer, a bondpad for the first metallization layer.

5. The method of claim 1, further comprising:
   before providing the first metallization layer, depositing active layers on a substrate layer to form the first set of emitters and the second set of emitters.

6. The method of claim 5, further comprising, before providing the first metallization layer and after depositing the active layers:
   positioning a first set of contacts on an uppermost layer of the active layers for each emitter of the first set of emitters of the first channel;
   positioning a second set of contacts on the uppermost layer of the active layers for each emitter of the second set of emitters of the second channel; and
   etching trenches in the active layers for each emitter of the first set of emitters and for each emitter of the second set of emitters.

7. The method of claim 6, further comprising, after etching trenches in the active layers, oxidizing the first set of emitters and the second set of emitters.

8. The method of claim 6, wherein the dielectric layer is a second dielectric layer; and
   wherein the method further comprises, after etching trenches in the active layers:
      depositing a first dielectric layer on the active layers; and
      etching, in the first dielectric layer, vias for the first set of contacts.

9. The method of claim 8, wherein:
   providing the first metallization layer comprises providing, after etching vias for the first set of contacts, the first metallization layer on the first set of contacts and the first dielectric layer; and
   depositing the second dielectric layer comprises depositing, after providing the first metallization, the second dielectric layer on the first metallization layer and the first dielectric layer.

10. The method of claim 9, further comprising:
    after depositing the second dielectric layer, etching, in the second dielectric layer and the first dielectric layer, vias for the second set of contacts; and
    wherein providing the second metallization layer comprises providing, after etching vias for the second set of contacts, the second metallization layer on the second set of contacts and the second dielectric layer.

11. The method of claim 10, further comprising:
    positioning a third set of contacts on the active layers for each emitter of a third set of emitters of a third channel,
       wherein the second metallization layer comprises a third interchannel portion positioned between the second set of emitters and the third set of emitters;
    depositing a third dielectric layer on the second metallization layer and the second dielectric layer; and
    providing a third metallization layer on the third set of contacts and the third dielectric layer,
       wherein the third metallization layer comprises a fourth interchannel portion positioned between the second set of emitters and the third set of emitters.

12. The method of claim 1, wherein the first metallization layer at least partially overlaps emission areas of the first set of emitters, and
    wherein the second metallization layer at least partially overlaps emission areas of the second set of emitters.

13. An optical chip, comprising:
    a first channel comprising a first set of emitters;
    a first set of contacts for the first set of emitters;
    a first dielectric layer;
    a first metallization layer on the first set of contacts and the first dielectric layer, wherein the first metallization layer comprises a first interchannel portion positioned between the first set of emitters and a second set of emitters;
a second channel comprising the second set of emitters, wherein the second channel is substantially parallel to the first channel;
a second set of contacts for the second set of emitters;
a second dielectric layer on the first metallization layer and the first dielectric layer; and
a second metallization layer on the second set of contacts and the second dielectric layer,
wherein the second metallization layer comprises a second interchannel portion positioned between the first set of emitters and the second set of emitters, and
wherein the second interchannel portion of the second metallization layer at least partially overlaps the first interchannel portion of the first metallization layer.

14. The optical chip of claim 13, wherein the first metallization layer comprises at least one of gold, aluminum, copper, or nickel gold; or
wherein the second metallization layer comprises at least one of gold, aluminum, copper, or nickel gold.

15. The optical chip of claim 13, wherein the first set of contacts comprises at least one of p-ohmic metal, n-ohmic metal, titanium, gold, or platinum; or
wherein the second set of contacts comprises at least one of p-ohmic metal, n-ohmic metal, titanium, gold, or platinum.

16. The optical chip of claim 13, wherein the first dielectric layer comprises at least one of a silicon nitride ($Si_3N_4$) layer, a silicon dioxide ($SiO_2$) layer, or an aluminum oxide ($Al_2O_3$) layer; or
wherein the second dielectric layer comprises at least one of a silicon nitride ($Si_3N_4$) layer, a silicon dioxide ($SiO_2$) layer, or an aluminum oxide ($Al_2O_3$) layer.

17. The optical chip of claim 13, wherein the first set of emitters and the second set of emitters are top-emitting vertical-cavity surface-emitting lasers.

18. The optical chip of claim 13, wherein the first set of emitters and the second set of emitters are bottom-emitting vertical-cavity surface-emitting lasers;
wherein the first metallization layer at least partially overlaps emission areas of the first set of emitters; and
wherein the second metallization layer at least partially overlaps emission areas of the second set of emitters.

19. The optical chip of claim 13, further comprising:
a third channel comprising a third set of emitters;
a third set of contacts for the third set of emitters; and
a third metallization layer on the third set of contacts and the first dielectric layer,
wherein the third metallization layer comprises a third interchannel portion positioned between the second set of emitters and the third set of emitters,
wherein the second dielectric layer is on the third metallization layer,
wherein the second metallization layer comprises a fourth interchannel portion positioned between the second set of emitters and the third set of emitters, and
wherein the fourth interchannel portion of the second metallization layer at least partially overlaps the third interchannel portion of the third metallization layer.

20. A time-of-flight system, comprising:
an array of emitters to emit optical beams into a field of view,
wherein the array of emitters comprises:
a first channel comprising a first set of emitters,
a second channel comprising a second set of emitters,
wherein the second channel is substantially parallel to the first channel,
a first metallization layer to provide electrical contact between a drive circuit and the first set of emitters,
a dielectric layer on the first metallization layer, and
a second metallization layer, on the dielectric layer, to provide electrical contact between the drive circuit and the second set of emitters,
wherein the second metallization layer at least partially overlaps with the first metallization layer;
the drive circuit; and
a receiver to receive light reflected from the field of view.

21. The time-of-flight system of claim 20, wherein the first set of emitters and the second set of emitters comprise at least one of top-emitting vertical-cavity surface-emitting lasers (VCSELs), bottom-emitting VCSELs, common anode VCSELs, common cathode VCSELs, or line scanning lasers.

22. The time-of-flight system of claim 20, wherein the dielectric layer is positioned between overlapping portions of the first metallization layer and the second metallization layer.

23. The time-of-flight system of claim 20, wherein the first metallization layer comprises a first bondpad,
wherein the second metallization layer comprises a second bondpad, and
wherein the drive circuit is electrically connected to the first bondpad and the second bondpad.

24. The time-of-flight system of claim 20, wherein:
the drive circuit is configured to generate one or more drive signals to drive the array of emitters to emit the optical beams into the field of view;
the receiver is configured to generate, based on the light reflected from the field of view, electrical signals; and
the time-of-flight system is configured to determine, based on the drive signals and the electrical signals, distances to one or more objects in the field of view.

* * * * *